(12) United States Patent
Condorelli et al.

(10) Patent No.: US 12,294,358 B2
(45) Date of Patent: May 6, 2025

(54) INTEGRATED ELECTRONIC SYSTEM WITH AN IMPROVED POWER-ON RESET CIRCUIT AND METHOD FOR CONTROLLING THE INTEGRATED ELECTRONIC SYSTEM

(71) Applicant: STMicroelectronics International N.V., Geneva (CH)

(72) Inventors: Riccardo Condorelli, Catania (IT); Antonino Mondello, Messina (IT); Michele Alessandro Carrano, Catania (IT); Daniele Mangano, San Gregorio di Catania (IT); Fabien Laplace, Charavines (FR); Luc Garcia, Saint Paul de Varces (FR); Michel Cuenca, Septemes les Vallons (FR)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/409,083

(22) Filed: Jan. 10, 2024

(65) Prior Publication Data

US 2024/0235546 A1 Jul. 11, 2024

(30) Foreign Application Priority Data

Jan. 11, 2023 (IT) .................. 102023000000216

(51) Int. Cl.
*H03K 17/22* (2006.01)
*G11C 5/14* (2006.01)

(52) U.S. Cl.
CPC ............... *H03K 17/22* (2013.01); *G11C 5/14* (2013.01)

(58) Field of Classification Search
None
See application file for complete search history.

(56) References Cited

U.S. PATENT DOCUMENTS

| 7,295,051 B2* | 11/2007 | Li .................. G06F 1/28 327/143 |
| 7,345,944 B1 | 3/2008 | Jenkins, IV |
| 8,321,170 B2* | 11/2012 | Schultz ............ G01D 18/008 702/104 |
| 2009/0102522 A1 | 4/2009 | Tang et al. |
| 2021/0351771 A1 | 11/2021 | Arakawa |

OTHER PUBLICATIONS

IT Search Report and Written Opinion for priority application, IT Appl. No. 102023000000216, report dated Jul. 25, 2023, 8 pgs.

* cited by examiner

*Primary Examiner* — Jeffrey S Zweizig
(74) *Attorney, Agent, or Firm* — Crowe & Dunlevy LLC

(57) ABSTRACT

A resettable digital stage operates when a supply voltage is higher than a threshold. A non-volatile memory stores a digital code read by a reading stage. A main power-on reset circuit generates a main reset signal controlling reset of the reading stage. A resettable volatile memory coupled to the reading stage stores a default value when reset. An auxiliary power-on reset circuit generates an auxiliary reset signal controlling reset of the volatile memory. Upon deactivation of the reset, the reading stage loads the digital code into the volatile memory. The main power-on reset circuit functions in a non-trimmed configuration response to the stored default value and in a trimmed configuration responsive to the stored digital code. The main power-on reset circuit has first and second operative thresholds which respectively fall within a first and second non-trimmed voltage range or within a first and second trimmed voltage range.

12 Claims, 5 Drawing Sheets

INTEGRATED ELECTRONIC SYSTEM WITH AN IMPROVED POWER-ON RESET CIRCUIT AND METHOD FOR CONTROLLING THE INTEGRATED ELECTRONIC SYSTEM

PRIORITY CLAIM

This application claims the priority benefit of Italian Application for Patent No. 102023000000216 filed on Jan. 11, 2023, the content of which is hereby incorporated by reference in its entirety to the maximum extent allowable by law.

TECHNICAL FIELD

The present invention relates to an integrated electronic system with an improved power-on reset circuit, as well as to a method for controlling the integrated electronic system.

BACKGROUND

As it is known, nowadays power-on reset circuits are available, which are analog circuits that are incorporated into respective integrated electronic systems, which further include a digital stage comprising a plurality of digital components (also known as cells), each of which is formed, as an example, by a number of corresponding logic gates. Each power-on reset circuit is configured to sense the supply voltage and apply a reset signal to the digital stage of the respective integrated electronic system, so as to activate/deactivate the reset of the digital stage, as a function of the current value of the supply voltage, so as to prevent the digital stage from outputting data while supplied with an insufficient supply voltage.

As an example, FIG. 1 shows an integrated electronic system 1, which includes a respective power-on reset (POR) circuit 2 and a digital stage 4. The POR circuit 2 has a respective input node, which is coupled, as an example, to a battery 6, which is configured to apply a supply voltage VDD to the input node of the POR circuit 2; in addition, the POR circuit 2 has an output node, upon which the POR circuit 2 generates a reset signal NPOR, which is a logic signal and is provided to the digital stage 4.

In order to clarify the functioning of the POR circuit 2, reference is made to FIG. 2, which refers to an exemplary scenario in which the supply voltage VDD linearly rises over time from 0V to a maximum voltage $V_{max}$, which is maintained for a certain amount of time; subsequently, the supply voltage VDD linearly decreases to 0V. Furthermore, FIG. 2 assumes that the integrated electronic system 1 belongs to a batch of integrated electronic systems (not shown) that have been manufactured starting from a same semiconductive wafer.

In detail, the electric behavior of any POR circuit of the batch, and thus also of the POR circuit 2, is characterized by four threshold voltages, hereinafter referred to as the threshold voltages VRmin, VRmax, VFmin and VFmax. This electric behavior is described here below, under the assumption that the reset of the digital stage 4 is activated and deactivated when the reset signal NPOR is respectively equal to '0' and '1'; put in other words, when the reset signal NPOR is equal to '0', the digital stage 4 is subject to reset, whereas, when the reset signal NPOR is equal to '1', the digital stage 4 is enabled to function.

This having been said, the following relationships usually apply: VRmax>VFmax>VRmin>VFmin. However, it is also possible that the following relationships apply: VRmax>VFmax>VRmin>VFmin.

Furthermore, assuming an initial condition VDD=0V, the reset signal NPOR remains equal to '0', until the supply voltage VDD reaches the threshold voltage VRmin. Then, as long as the supply voltage VDD is comprised between the threshold voltages VRmin and VRmax, the value of the reset signal NPOR is uncertain, i.e., it depends on the POR circuit of the integrated electronic system of the batch. In fact, for any integrated electronic system of the batch, the corresponding POR circuit switches the reset signal NPOR to '1' when the supply voltage VDD overcomes a respective first operative threshold, which varies among the integrated electronic systems of the batch because of silicon process variations; furthermore, the value of the first operative threshold may vary as a function of the temperature. This uncertainty region is shown in FIG. 2.

When the supply voltage VDD overcomes the threshold voltage VRmax, in all the integrated electronic systems of the batch the reset signal NPOR is equal to '1', therefore the reset of the digital stage 4 is deactivated. Furthermore, the reset signal NPOR remains equal to '1' as long as the supply voltage VDD is greater than the threshold voltage VFmax. Then, as long as the supply voltage VDD is comprised between the threshold voltages VFmax and VFmin, the value of the reset signal nPOR is uncertain, i.e., it depends on the POR circuit of the integrated electronic system of the batch. In fact, for any integrated electronic system of the batch, the corresponding POR circuit switches the reset signal NPOR to '0' when the supply voltage VDD drops below a respective second operative threshold, which varies among the integrated electronic systems of the batch because of silicon process variations; furthermore, the value of the second operative threshold may vary as a function of the temperature. This uncertainty region is shown in FIG. 2. For any integrated electronic system of the batch, the respective second operative threshold is lower than the respective first operative threshold.

Finally, when the supply voltage VDD drops below the threshold voltage VFmin, in all the integrated electronic systems of the batch the reset signal NPOR is equal to '0', therefore the reset of the digital stage 4 is activated.

From another point of view, given any POR circuit of the batch of integrated electronic systems, when the reset signal NPOR is equal to '0', the POR circuit sets the reset signal NPOR to '1' when the supply voltage VDD overcomes the respective first operative threshold; when the reset signal NPOR is equal to '1', the POR circuit sets the reset signal NPOR to '0' when the supply voltage VDD drops below the respective second operative threshold. The value of the first operative threshold falls within the range [VRmax-VRmin]; the value of the second operative threshold falls within the range [VFmax-VFmin]; at least to a first approximation VRmax-VRmin=VFmax-VFmin=$\Delta V$, wherein $\Delta V$ represents a tolerance/uncertainty voltage; as an example, $\Delta V$=90 mV. Furthermore, at least to a first approximation, VFmax=VRmax-$\Delta H$ and VFmin=VRmin-$\Delta H$, wherein $\Delta H$ represents a hysteresis voltage (as an example equal to 30 mV), which depends on the circuit implementation of the POR circuit.

In practice, the quantity $\Delta V$ depends on many factors, such as: manufacturing process tolerances; temperature variations; mechanical stresses induced by the packages of the integrated electronic systems; resistor mismatches.

In view of the above, the threshold voltage VRmax represents the voltage above which the reset release is guaranteed for any POR circuit of the batch of integrated electronic systems, whereas the threshold voltage VFmin represents the voltage below which the reset assertion is guaranteed for any POR circuit of the batch of integrated electronic systems.

As shown in FIG. 3, the digital stage 4 may comprise a plurality of digital cells 10 and a power supply grid 12, which electrically connects each digital cell 10 to a principal node 14.

Each digital cell 10 forms a corresponding digital circuit, such as, as an example, a logic gate. Furthermore, the principal node 14 is configured to be set to the supply voltage VDD; therefore, though not shown, the principal node 14 is connected to the input node of the POR circuit 2. Each digital cell 10 has a respective supply terminal, which is connected to the supply grid 12, so that the supply grid 12 provides the digital cells 10 with the supply voltage VDD; furthermore, each digital cell 10 has a respective reset terminal, which is coupled to the POR circuit 2 so as to receive the reset signal NPOR.

Based on the semiconductor technology adopted to form the digital stage 4, the digital cells 10 work only if their supply voltage exceeds a minimum value (as an example, equal to 1.6V), hereinafter referred to as the voltage VCmin. Therefore, the voltage VCmin represents the minimum value of the supply voltage VDD such that the functioning of the digital stage 4 is guaranteed.

Again, with reference to the example shown in FIG. 2, the threshold voltage VFmin is equal to the voltage VCmin, so that the digital stage 4 is subject to reset when the supply voltage VDD drops below the voltage VCmin, thereby preventing the functioning of the digital stage 4 when the value of the supply voltage VDD is not sufficient to guarantee the proper functioning of the digital stage 4. However, other examples are possible, wherein the POR circuits of the batch are configured so that the threshold voltage VFmin is higher than to the voltage VCmin; in this case, since, as explained above, the digital stage 4 is subject to reset as soon as the supply voltage VDD drops below the threshold voltage VFmin, the reset occurs at a voltage higher than the voltage VCmin, thereby providing a safety margin. Furthermore, the digital cells 10 are faster than when supplied with the voltage VCmin, thereby easing the design constraints of the integrated electronic system 1 or allowing the adoption of digital cells that are less performing, with the same supply voltage VDD.

FIG. 2 also shows a voltage VDDmin, which represents the minimum value that has to be overcome by the supply voltage VDD in order to certainly release the reset, i.e., to cause the digital stage 4 to function, irrespective of the POR circuit of the batch that is effectively considered.

The difference between the voltage threshold VRmax and the voltage threshold VFmin (which coincides, in the example of FIG. 2, with VDDmin-VCmin) depends on the circuit implementation of the POR circuit 2. Furthermore, VRmax-VFmin=$\Delta V+\Delta H$; therefore, VRmax-VFmin may be equal, as an example, to 120 mV, in which case, assuming as an example again VCmin=1.6V, VDDmin=1.72V.

Generally, while the value of the hysteresis $\Delta V$ is designed in order provide a safeguard against the asserting/releasing of the reset when VRmax<VDD<VFmax, the quantity $\Delta V$ has to be as low as possible, so as to reduce the minimum voltage (i.e., VDDmin) that has to be provided to the integrated electronic system 1 in order to function, irrespective of whether the VFmin is equal to, or higher than the voltage VCmin. However, as explained above, the difference between the voltage threshold VRmax and the voltage threshold VFmin depends on the tolerances of the manufacturing technological process, so it cannot be easily reduced, unless adopting expensive and complicated manufacturing technologies.

There is a need in the art to provide a solution which at least partially overcomes the drawbacks of the prior art.

SUMMARY

In an embodiment, an integrated electronic system is supplied with a supply voltage and comprises: a digital stage of a resettable type that is configured to work if the supply voltage is higher than a main voltage threshold, said digital stage comprising a non-volatile memory, which is configured to store a digital code, and a reading stage, which is coupled to the non-volatile memory. A main power-on reset circuit is configured to generate a main reset signal in a manner such that the main reset signal is alternatively equal to a respective logic reset value and a respective logic non-reset value, the reset of the reading stage being activated when the main reset signal is respectively equal to the respective logic reset value and deactivated when the main reset signal is respectively equal to the respective logic non-reset value.

The main power-on reset circuit is configured to: when the main reset signal is equal to the respective logic reset value, set the main reset signal to the respective logic non-reset value when the supply voltage overcomes a first operative threshold; and when the main reset signal is equal to the respective logic non-reset value, set the main reset signal to the respective logic reset value when the supply voltage drops below a second operative threshold.

The integrated electronic system further comprises: a volatile memory of a resettable type and coupled to the reading stage, the volatile memory being configured to store a default value, when subject to reset; and an auxiliary power-on reset circuit configured to generate an auxiliary reset signal in a manner such that the auxiliary reset signal is alternatively equal to a respective logic reset value or a respective logic non-reset value, the reset of the volatile memory being activated or deactivated when the auxiliary reset signal is respectively equal to the respective logic reset value or the respective logic non-reset value.

The auxiliary power-on reset circuit is configured to: when the auxiliary reset signal is equal to the respective logic reset value, set the auxiliary reset signal to the respective logic non-reset value when the supply voltage overcomes a first auxiliary operative threshold; and when the auxiliary reset signal is equal to the respective logic non-reset value, set the auxiliary reset signal to the respective logic reset value, when the supply voltage drops below a second auxiliary operative threshold, the first and the second auxiliary operative thresholds being lower than the main voltage threshold.

The reading stage is configured to load, following the deactivation of the reset of the reading stage, the digital code into the volatile memory, which is configured to store the digital code until the reset of the volatile memory is activated.

The main power-on reset circuit is configured to function alternatively in a non-trimmed configuration and in a trimmed configuration, when the volatile memory respectively stores the default value or the digital code. When the main power-on reset circuit functions in the non-trimmed configuration, the first and the second operative thresholds respectively fall within a first and a second non-trimmed voltage range ([VRmax-VRmin],[VFmax-VFmin]), which extend above said main voltage threshold. When the main power-on reset circuit functions in the trimmed configuration, the first and the second operative thresholds respectively fall within a first and a second trimmed voltage range ([VRmax'-VRmin'], [VFmax'-VFmin']), which respectively fall inside the first and the second non-trimmed voltage ranges ([VRmax-VRmin],[VFmax-VFmin]).

BRIEF DESCRIPTION OF THE DRAWINGS

For a better understanding of the present invention, embodiments thereof are now described, purely by way of non-limiting example, with reference to the attached drawings, wherein.

DETAILED DESCRIPTION

Figure 4:
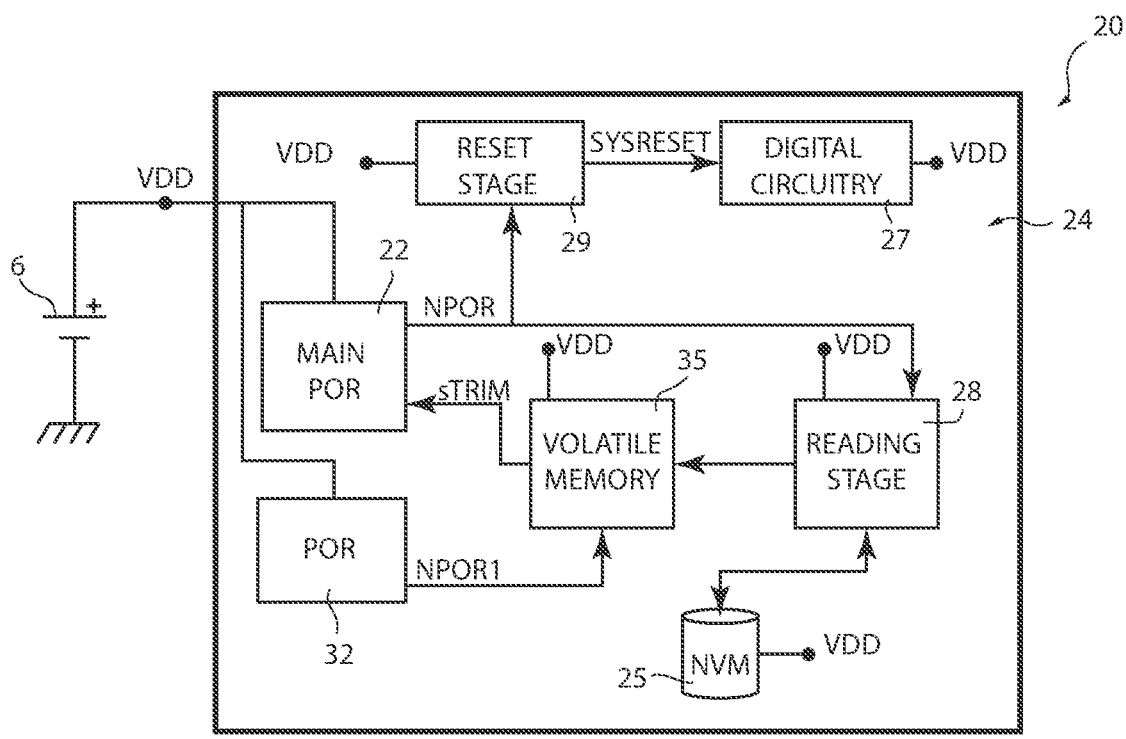
FIG. 4 shows a circuit scheme of the present integrated electronic system.

FIG. 4 shows an integrated electronic system 20, which includes a power on reset (POR) circuit 22, hereinafter referred to as the main POR circuit 22, and a digital stage 24, which includes: a non-volatile memory 25; a digital circuitry 27; a reading stage 28; and a reset stage 29.

Each of the non-volatile memory 25, the digital circuitry 27, the reading stage 28 and the reset stage 29 has a respective supply terminal, which is set to the supply voltage VDD.

The digital circuitry 27 may be of any type per se known. As an example, the digital circuitry 27 may be of the same type as the digital stage 24 shown in FIG. 2. As a further example, the digital circuitry 27 may implement a latch or a flip-flop or any known logic gate.

The main POR circuit 22 is configured to generate a reset signal NPOR, as a function of the supply voltage VDD. Furthermore, the reading stage 28 and the reset stage 29 have respective reset terminals, which are configured to receive the reset signal NPOR. In addition, the reset stage 29 is configured to generate a system signal SYSRESET, as a function of the reset signal NPOR; the digital circuitry 27 has a respective reset terminal, which receives the system signal SYSRESET from the reset stage 29.

As an example, the system signal SYSRESET may coincide with the reset signal NPOR. As an alternative, the reset stage 29, which is optional, may be controlled by an external user (e.g., through a switch arranged on a board, in case the integrated electronic system 20 is mounted on the board), so as to cause a reset of the digital circuitry 27, when NPOR='1'.

In practice, the reset of either the non-volatile memory 25 and the digital circuitry 27 is controlled by the reset signal NPOR. In particular, the non-volatile memory 25 and the digital circuitry 27 are subject to reset (i.e., their resets are activated) when the reset signal NPOR is equal to '0'. In particular, if the reset stage 29 is controllable by the user, the system signal SYSRESET may be equal to the reset signal NPOR, when this latter is equal to '0'. Furthermore, when the reset signal NPOR is equal to '1', the system signal SYSRESET is equal to '1', in the absence of input by the user; on the contrary, in case the user provides an input to the reset stage 29, the system signal SYSRESET is set to '0'.

The non-volatile memory 25 is configured to store in a non-volatile manner (i.e., irrespective of the effective presence of the supply voltage VDD) a digital value, hereinafter referred to as the digital code.

In addition, the integrated electronic system 20 includes a further POR circuit 32, hereinafter referred to as the auxiliary POR circuit 32; as explained in greater detail in the following, the auxiliary POR circuit 32 is configured to generate an auxiliary reset signal NPOR1, as a function of the supply voltage VDD.

Figure 2:
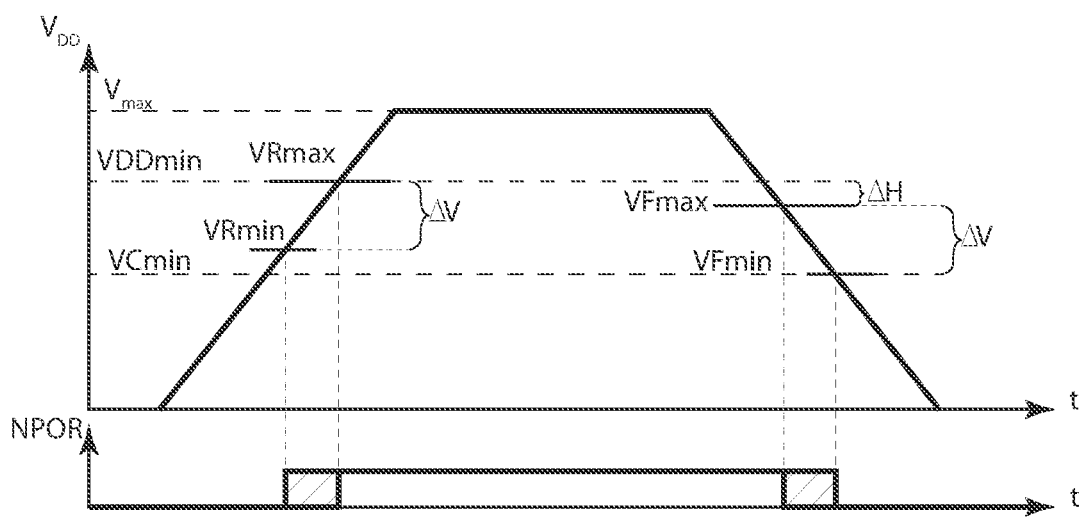
FIG. 2 shows plots over time of a supply voltage and a reset signal.
Figure 5:
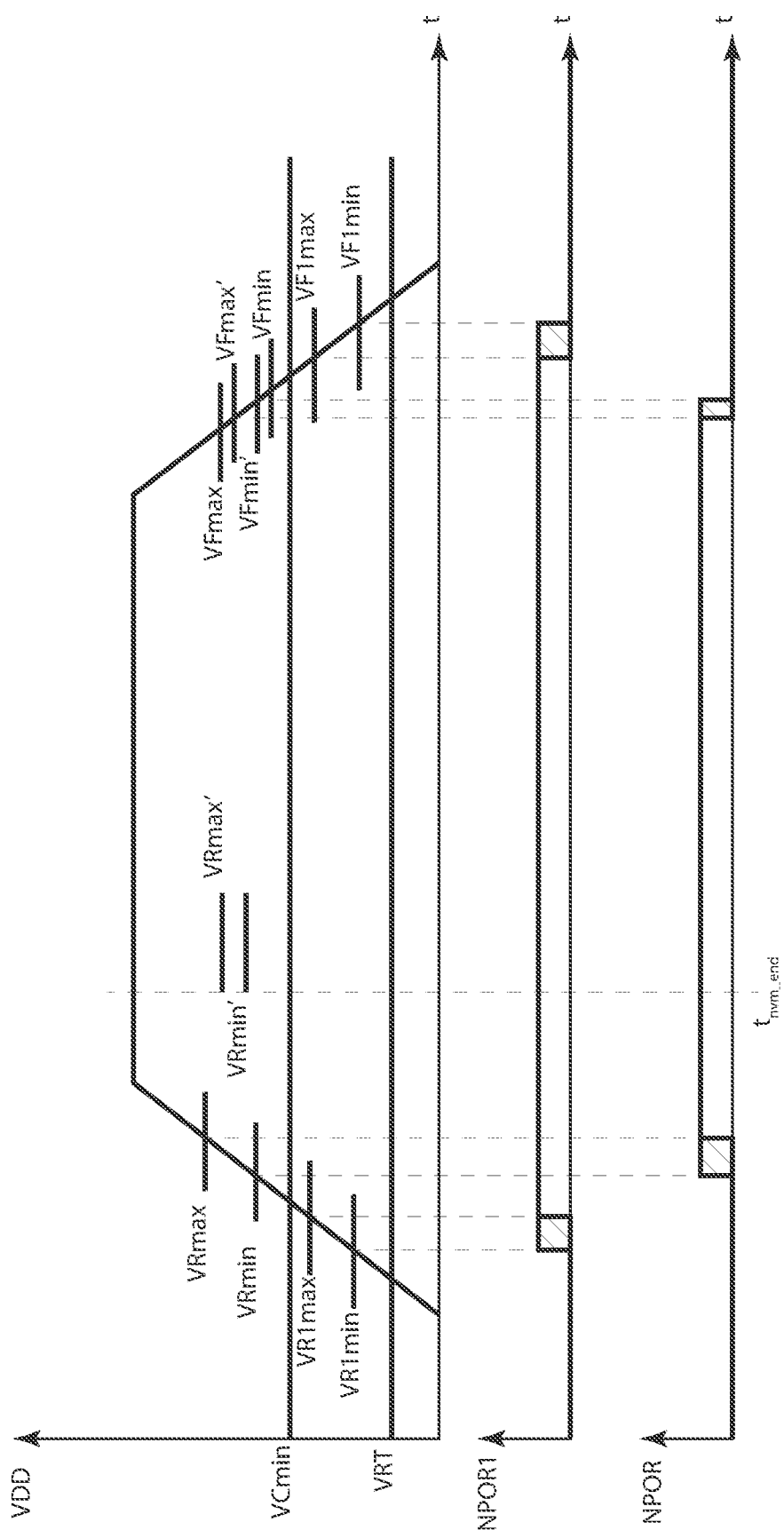
FIGS. 5, 7 and 8 show plots over time of supply voltages and reset signals.

The auxiliary POR circuit 32 functions in the same way described with reference to FIG. 2, but for the difference that its electric behavior (i.e., the generation of the auxiliary reset signal NPOR1) is governed by the four auxiliary threshold voltages VR1min, VR1max, VF1min and VF1max, which are shown in FIG. 5, which refers, as an example, to the case VFmin>VCmin. In particular, VCmin>VR1max>VF1max>VR1min>VF1min; the relationship VF1max>VR1min is irrelevant for the functioning of the integrated electronic system 20.

In practice, the auxiliary POR circuit 32 works even when the supply voltage VDD is lower than the voltage VCmin, which, as explained before, represents the minimum value of the supply voltage VDD such that the functioning of the digital stage 24 (and thus of the reading stage 28 and the digital circuitry 27) is guaranteed. Furthermore, when the auxiliary reset signal NPOR1 is equal to '0', the auxiliary POR circuit 32 sets the auxiliary reset signal NPOR1 to '1' when the supply voltage VDD overcomes a respective first operative threshold, which falls within the range [VR1max-VR1min]; in addition, when the auxiliary reset signal NPOR1 is equal to '1', the auxiliary POR circuit 32 sets the auxiliary reset signal NPOR1 to '0' when the supply voltage VDD drops below a respective second operative threshold, which falls within the range [VF1max-VF1min]. The second operative threshold of the auxiliary POR circuit 32 is lower than the first operative threshold of the auxiliary POR circuit 32.

In addition, the integrated electronic system 20 comprises a volatile memory 35, which may be formed, as an example, by a memory register including a plurality of flip-flop circuits (not shown).

In detail, the volatile memory 35 includes: a respective supply terminal, which is set to the supply voltage VDD; a respective reset terminal, which is connected to the auxiliary POR circuit 32, to receive the auxiliary reset signal NPOR1; and an output terminal, whereon a signal sTRIM is present.

In greater detail, the reading stage 28 is coupled to the non-volatile memory 25 and the volatile memory 35. Therefore, in use, upon the assumption of the logic value '1' by the reset signal NPOR, the reading stage 28 reads the digital code stored by the non-volatile memory 25 and loads the digital code into the volatile memory 35; furthermore, the reading stage 28 signals to the volatile memory 35 the completion of the loading of the digital code. Upon completion of the loading of the digital code, the signal sTRIM represents the digital code, which is stored by the volatile memory 35. Furthermore, the volatile memory 35 is capable of storing the digital code as long as the supply voltage VDD is greater than or equal to a retention voltage VRT (shown in FIG. 5), with VF1min≥VRT. It is also anticipated that, for reasons that will be made clear hereinafter, when subject to reset, as well as until the completion of the loading of the digital code, the signal sTRIM represents a default value of the volatile memory 35.

Again, with reference to the main POR circuit 22, it is a POR circuit with adjustable thresholds, therefore it includes a trimming terminal, which is coupled to the output terminal of the volatile memory 35, to receive the signal sTRIM.

Figure 6:
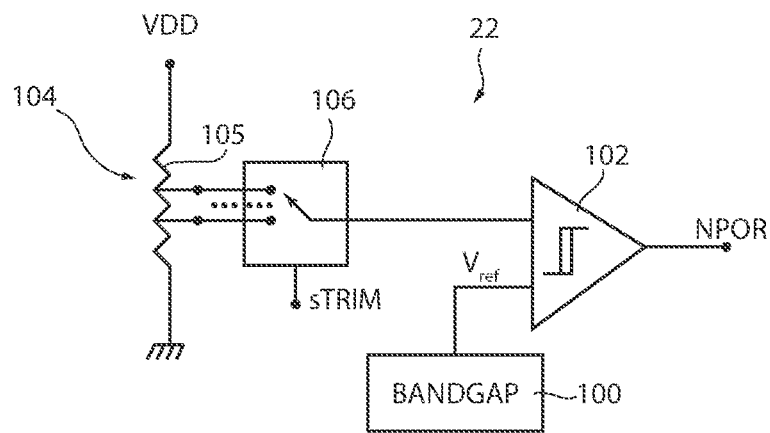
FIG. 6 shows a circuit scheme of a power-on reset circuit.
Figure 3:
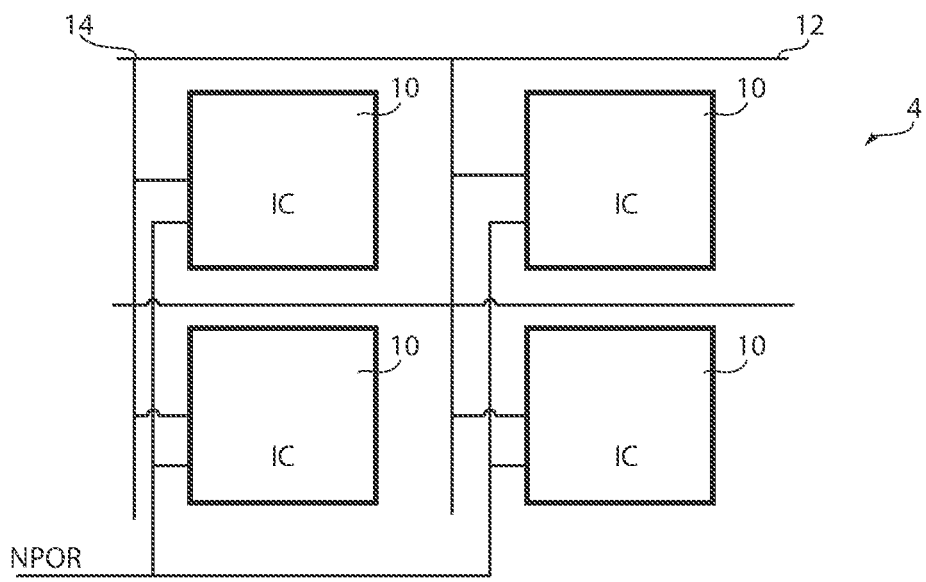
FIG. 3 shows a circuit scheme of a digital stage.

As an example, FIG. 6 shows a possible electric model of the main POR circuit 22. In particular, the main POR circuit 22 comprises: a bandgap circuit 100 configured to generate a reference voltage $V_{ref}$; a voltage comparator 102 with hysteresis; a resistive divider 104; and a selector 106.

The bandgap circuit 100 provides the reference voltage $V_{ref}$ on a first input terminal of the voltage comparator 102. The resistive divider 104 includes a respective resistor 105, which has a respective first terminal, which is set to the supply voltage VDD, and a respective second terminal, which is connected to ground. Furthermore, the resistive divider 104 features a plurality of respective output terminals, which are distributed along the resistor 105, so as to implement different values of the divider ratio ("rapporto di partizione").

The selector 106 has a control terminal, which forms the trimming terminal of the main POR circuit 22; the control terminal of the selector 106 is coupled to the output terminal of the volatile memory 35, to receive the signal sTRIM.

In use, the selector 106 selects one of the output terminals of the resistive divider 104, as a function of the default value or digital code represented by the signal sTRIM, and couples the selected output terminal of the resistive divider 104 to the second input terminal of the voltage comparator 102, which generates, on its output terminal, the reset signal NPOR. In practice, because of the hysteresis, the voltage comparator 102 implements the first and the second operative thresholds of the main POR circuit 22, which are compared with the supply voltage VDD; by selecting the output terminals of the resistive divider 104, it is possible to adjust the values of the first and the second operative thresholds of the main POR.

From an operative point of view, the main POR circuit 22 is configured to operate alternatively in a first configuration, hereinafter referred to as the non-trimmed configuration, or in a second configuration, hereinafter referred to as the trimmed configuration. In particular, the main POR circuit 22 operates in the non-trimmed configuration and in the trimmed configuration when the signal sTRIM represents, respectively, the default value of the volatile memory 35 or the digital code.

In detail, the functioning of the main POR circuit 22 is described here below, with reference to FIG. 5.

Figure 1:
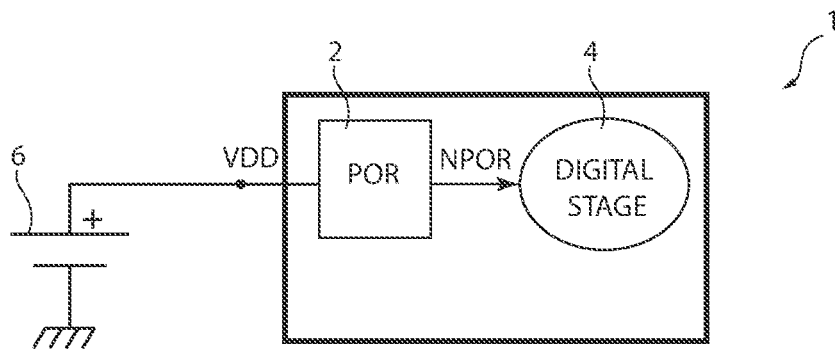
FIG. 1 shows a block scheme of an integrated electronic circuit.

In greater detail, when working in the non-trimmed configuration, the main POR circuit 22 works in the same way as discussed with reference to the POR circuit 2 of FIG. 1, therefore its electric behavior is governed by the abovementioned threshold voltages VRmin, VRmax, VFmin and VFmax. In particular, the first and the second operative thresholds of the main POR circuit 22 respectively fall within the range [VRmax-VRmin] and the range [VFmax-VFmin], which apply to all the integrated electronic systems that belong to the same manufacturing batch as the integrated electronic system 20.

When working in the trimmed configuration, the main POR circuit 22 functions in the same way as the non-trimmed configuration, but for the difference that its electric behavior (i.e., the generation of the reset signal NPOR) is governed by trimmed threshold voltages VRmin', VRmax', VFmin' and VFmax', which depend on the digital code. In a per se known manner, it is possible to determine the digital code so that the following relationships apply:

$$VRmax > VRmax' > VRmin' > VRmin;$$

$$VFmax > VFmax' > VFmin' > VFmin; \text{ and}$$

$$VRmax' - VRmin' = VFmax' - VFmin' \text{(to a first approximation)}.$$

As a consequence, when the main POR circuit 22 works in the trimmed configuration, the first and the second operative threshold of the main POR circuit 22 respectively fall within the range [VRmax'-VRmin'] and the range [VFmax'-VFmin']. Furthermore, the second operative threshold of the main POR circuit 22 remains lower than the first operative threshold of the main POR circuit.

In greater detail, the digital code may be determined by performing a per se known characterization of the integrated electronic system 20, and then it may be stored in the non-volatile memory 25.

In particular, referring to the first operative threshold of the main POR circuit 22 and the ranges [VRmax-VRmin] and [VRmax'-VRmin'] (but the same considerations apply to the second operative threshold and the ranges [VFmax-VFmin] and [VFmax'-VFmin']), the digital code allows to trim the main POR circuit 22, so as to cancel the contributions to the uncertainty on the position of the first operative threshold due to manufacturing process tolerances, as well as to the packaging stress and the mismatches. Therefore, as mentioned before, the ranges [VRmax'-VRmin'] and [VFmax'-VFmin'] respectively fall inside the ranges [VRmax-VRmin] and [VFmax-VFmin].

This having been said, the integrated electronic system 20 functions as explained here below, with reference to FIG. 5, which refers to the same profile of the supply voltage VDD as FIG. 2.

At the beginning, since the supply voltage VDD is null, the reset signal NPOR and the auxiliary reset signal NPOR1 are set to '0', therefore the digital circuitry 27, the reading stage 28 and the volatile memory 35 are subject to reset and the signal sTRIM represents the default value of the volatile memory 35; therefore, the main POR circuit 22 operates in the abovementioned non-trimmed configuration.

The auxiliary reset signal NPOR1 switches to '1' at the latest when the supply voltage VDD overcomes the auxiliary threshold VR1max; when the auxiliary reset signal NPOR1 becomes equal to '1', the reset of the volatile memory 35 is deactivated, however the signal sTRIM continues to represent the default value, and the main POR circuit 22 continues to operate in the non-trimmed configuration. The digital stage 24 is still subject to reset.

The reset signal NPOR switches to '1' at the latest when the supply voltage VDD overcomes the threshold VRmax, thereby deactivating the reset of the digital circuitry 27 and of the reading stage 28. As a consequence, the reading stage 28 reads the digital code permanently stored in the non-volatile memory 25 and loads the digital code into the volatile memory 35. In the example of FIG. 5, the loading of the digital code into the volatile memory 35 is completed at a time instant $t_{nvm\_end}$.

Upon completion of the loading of the digital code into the volatile memory 35, the reading stage 28 signals to the volatile memory 35 the completion of the loading, so that, after the time instant $t_{nvm\_end}$, the signal sTRIM represents the digital code. As a consequence, at the time instant $t_{nvm\_end}$, the main POR circuit 22 starts to work in the trimmed configuration.

Since the main POR circuit 22 operates in the trimmed configuration, the reset signal NPOR switches to '0' at the latest when the supply voltage VDD drops below the trimmed threshold voltage VFmin'. This implies, that, when the supply voltage VDD drops below the trimmed threshold voltage VFmin', the digital circuitry 27 and the reading stage 28 are certainly subject to reset. On the contrary, the auxiliary reset signal NPOR1 stays equal to '1', at least as long as the supply voltage VDD remains higher than the auxiliary threshold voltage VF1max; therefore, as long as the supply voltage VDD remains higher than the auxiliary threshold voltage VF1max, the signal sTRIM represents the digital code, owing to the capability of the volatile memory 35 of keeping stored the digital code as long as the supply voltage VDD remains higher than the retention voltage VRT.

The auxiliary reset signal NPOR1 switches to '0' at the latest when the supply voltage VDD drops below the auxiliary threshold voltage VF1min, so as to subject the volatile memory 35 to reset before this latter enters a supply range such that the storing of the digital code is no more guaranteed. The reset of the volatile memory 35 causes the signal sTRIM to represent the default value, and thus causes the main POR circuit 22 to switch back into the non-trimmed configuration, thereby re-establishing, for the first and the second operative thresholds of the main POR circuit 22, the ranges [VRmax-VRmin] and [VFmax-VFmin].

In practice, the threshold voltage VRmax represents the minimum value that, when the main POR circuit 2 functions in the non-trimmed configuration, has to be overcome by the supply voltage VDD in order to certainly deactivate the reset of the digital stage 24, whereas the trimmed threshold voltage VRmax' represents the minimum value that has to be overcome by the supply voltage VDD in order to certainly deactivate the reset of the digital stage 24, when the main POR circuit 2 functions in the non-trimmed configuration.

Owing to the switching from the non-trimmed configuration to the trimmed configuration of the main POR circuit 22, the present solution provides for switching from the range [VRmax-VFmin] to the range [VRmax'-VFmin']. Therefore, since VRmax'<VRmax, the present solution allows to reduce the minimum operating voltage of the integrated electronic system 20; such a reduction is maintained at least as long as the supply voltage VDD remains higher than the auxiliary threshold voltage VF1max. Furthermore, this solution exploits the capability of the volatile memory 35 of loading the digital code from the non-volatile memory 25, when VDD>VCmin, and retaining the digital code as long as VDD>VRT.

Figure 7:
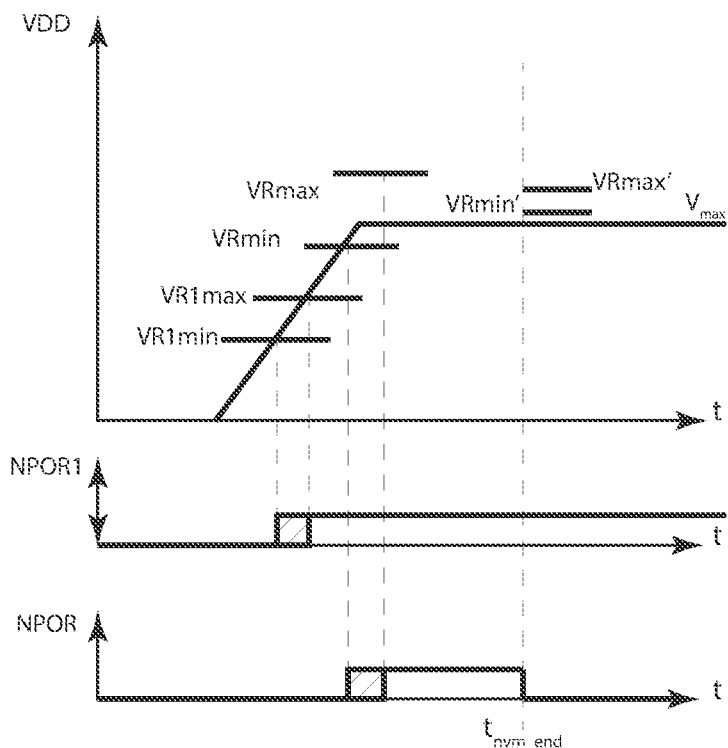
Figure 8:
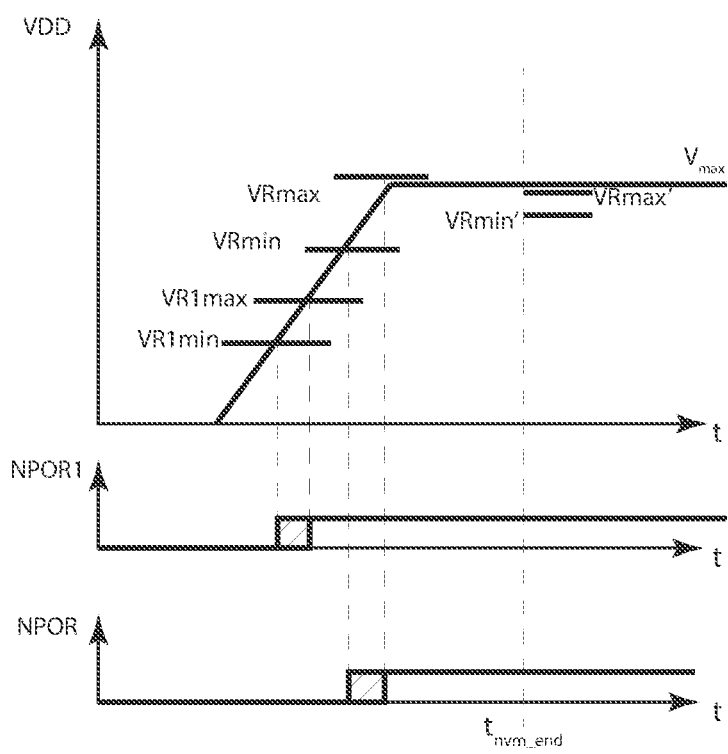

As a further example, as shown in FIGS. 7 and 8, in case the maximum value $V_{max}$ of the supply voltage VDD falls into the range [VRmax-VRmin] and the main POR circuit 22 has set to '1' the reset signal NPOR, at the time instant $t_{nvm\_end}$ the reset signal NPOR is alternatively set to '0', if the maximum value $V_{max}$ of the supply voltage VDD is lower than the range [VRmax'-VRmin'] (FIG. 7), or kept equal to '1', if the maximum value $V_{max}$ of the supply voltage VDD is higher than the range [VRmax'-VRmin'] (FIG. 8). In practice, the trimming of the main POR circuit 22 allows to reduce the range of uncertainty and thus to subject the digital circuitry 24 to reset, if the supply voltage VDD, though falling into the range [VRmax-VRmin], is not sufficient to cause the digital circuitry 24 to properly work.

Figure 9:
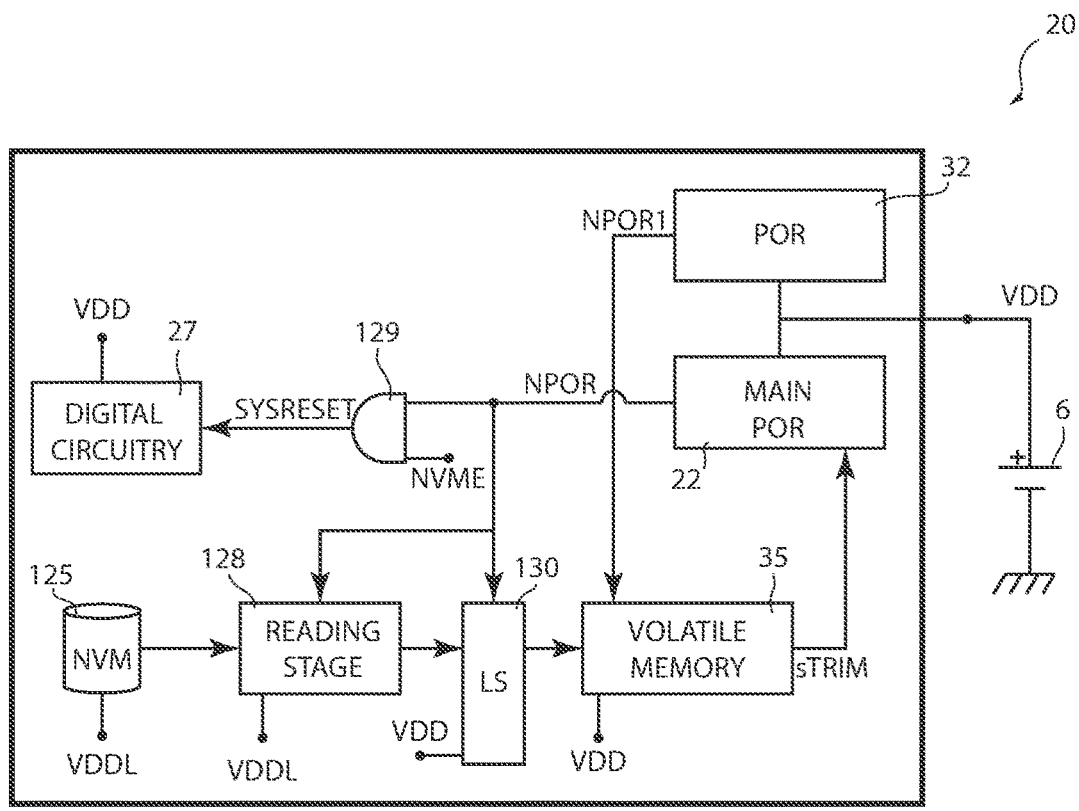
FIG. 9 shows a circuit scheme of a variant of the integrated electronic system shown in FIG. 4.

As a further example, FIG. 9 shows a variant of the integrated electronic system 20, in which the non-volatile memory (here indicated with 125) is supplied with a reduced supply voltage VDDL, which may be derived from the supply voltage VDD in a per se known manner (not shown), in a manner such that VDDL<VDD. Also, the reading stage (here indicated with 128) is supplied with the reduced supply voltage VDDL.

Furthermore, the integrated electronic system 20 includes a logic gate 129 and a level-shifter 130, which are both supplied with the supply voltage VDD.

The functioning of the reading stage 128 is the same as before; the level-shifter 130 acts as a domain interface between the low-voltage domain of the non-volatile memory 125 and the reading stage 128 and the high-voltage domain on the volatile memory 35. Therefore, in use, when the reset signal NPOR goes to '1', the reading stage 128 reads the digital code stored in the non-volatile memory 125 and transfers it into the volatile memory 35 through the level-shifter 128. Owing to the presence of the low-voltage domain, the power consumption is reduced.

Furthermore, the logic gate 129 is of the AND type and generates the system signal SYSRESET as a result of an operation of logic AND between the reset signal NPOR and a signal NVME, which is generated by the reading stage 128 so that it switches from '0' to '1' upon completion of the loading of the digital code into the volatile memory 35. This solution guarantees that the reset of the digital circuitry 27 is released only after the digital code has been loaded into the volatile memory 35, i.e., after the main POR circuit 22 has switched into the trimmed configuration.

Variants (not shown) are possible which feature either: i) the reset of the digital circuitry 27 through the logic gate 129, or ii) the presence of the low-voltage domain and the level-shifter 130.

The advantages that the present solution affords are clear from the foregoing description.

In particular, the advantages in terms of reduction of the voltage VDDmin have already been explained. This advantage is obtained without introducing the risk of inducing reset oscillations, which could arise in case of absence of the auxiliary POR circuit 32.

In addition, this solution allows to benefit from the trimmed threshold voltage VFmin', instead of the threshold voltage VFmin; since VFmin'>VFmin, the digital circuitry 27 works at a voltage higher than the voltage VCmin, therefore it is faster.

Finally, it is clear that modifications and variations may be made to the integrated electronic system, without thereby departing from the scope of the present invention, as defined in the attached claims.

For example, the reset signal NPOR and/or the auxiliary reset signal NPOR1 may be replaced by their logic negations (not shown), hereinafter referred to as the reset signal POR and the auxiliary reset signal POR1. In this case, the reset signal POR and/or the auxiliary reset signal POR1 cause the reset of the components (e.g., the digital stage and the volatile memory) they are respectively applied to when they are equal to '1'. In case the reset signal NPOR is replaced by the reset signal POR, and considering the embodiment shown in FIG. 9, the logic gate 129 is of the OR type.

It is also possible for the digital circuitry 27 to be connected to a secondary supply circuit (not shown), in order to receive a secondary supply voltage, instead of the supply voltage VDD; the secondary supply voltage may be generated by scaling the supply voltage VDD, which is monitored by the main POR circuit 22 and the auxiliary POR circuit 32. Also in this case, the reset of the digital circuitry 27 may be controlled by the reset signal NPOR; a level-shifter may be interposed between the main POR circuit 22 and the digital circuitry 27. In addition, also in this case the voltage VCmin represents the minimum value of the supply voltage VDD such that the functioning of the digital circuitry 27 is guaranteed.

Furthermore, referring to the main POR circuit 22, variants are possible in which the voltage comparator 102 does not implement any hysteresis, and the hysteresis of the main POR circuit 22 is achieved by adopting, in the resistive divider 104, an additional resistor (not shown) that has a value of resistance different from the one of the resistor 105 and features a plurality of respective output terminals, which are distributed along the additional resistor, so as to implement different values of an additional divider ratio. In this case, the selector 106 selects one of the output terminals of the resistor 105 or one of the output terminals of the additional resistor, respectively when the reset signal NPOR is equal to '0' and when the reset signal NPOR is equal to '1'. In any case, the technical details of the implementation of the hysteresis in the main POR circuit 22 and the auxiliary POR circuit 32 are irrelevant for the functioning of the present integrated electronic system and may thus be varied.

Figure 10:
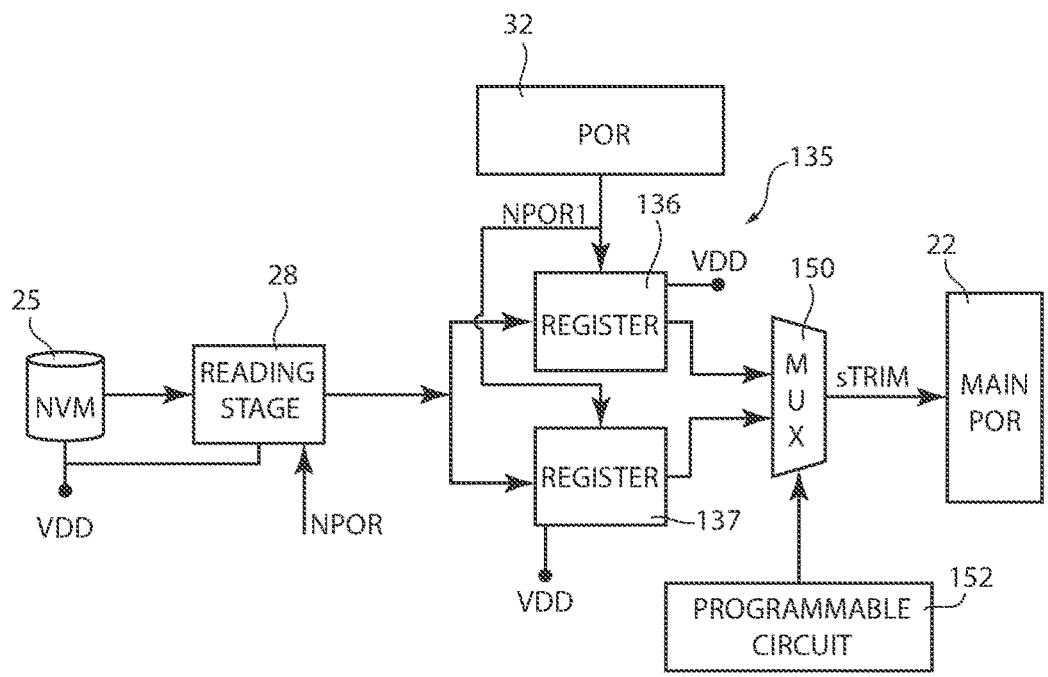
FIG. 10 shows a circuit scheme of a portion of a further variant of the integrated electronic system shown in FIG. 4.

Furthermore, variants are possible, such as the one shown in FIG. 10, which shows, for the sake of simplicity, only part of the integrated electronic system 20.

In particular, the volatile memory (here indicated with 135) includes a first and a second register 136, 137, which may be formed by corresponding arrays of latch circuits (not shown), the reset of which is controlled by the auxiliary reset signal NPOR1; the first and the second registers 136, 137 are supplied with the supply voltage VDD and are coupled to the reading stage 28. In a per se known manner, the first and the second registers 136, 137 are such that, when subject to the reset (i.e., when NPOR1="0"), the first register 136 stores a number N of bits equal to '1', whereas the second register 137 stores a number equal to N of bits equal to '0'.

Upon release of its reset (i.e., when the reset signal NPOR goes to '1'), the reading stage 28 loads into the first and the second registers 136, 137 the digital code stored in the non-volatile memory 25. Before this loading, the bits of the first and the second registers 136, 137 remain respectively equal to '1' and '0'.

In addition, the integrated electronic system 20 comprises a multiplexer 150 and a programmable circuit 152.

The multiplexer 150 is controllable so as to select, for each pair of corresponding bits of the first and the second registers 136, 137, one of the bits of the pair. In greater detail, for i=1, . . . , N, the multiplexer alternatively selects REG136[$i$] or REG137[$i$], wherein REG136[$i$] and REG137[$i$] indicate the i-th bit of the first and, respectively, the second registers 136, 137.

The programmable circuit 152 is of the one-time programmable type. In a per se known manner, the programmable circuit 152 may include an array of fuses (not shown), whose state can be programmed only one time, so that the programmable circuit 152 permanently stores a string of bits; in particular, the string is formed by a number of bits equal to number N.

The multiplexer 150 is controlled by the programmable circuit 152 in a manner such that, for i=1, . . . , N, the multiplexer 150 selects alternatively REG136[$i$] (which, when NPOR1='0' and before the loading of the digital code, is equal to '1') or REG137[$i$] (which, when NPOR1='0' and before the loading of the digital code, is equal to '0') as a function of the logic value of the i-th bit of the string stored by the programmable circuit 152. As an example, the multiplexer 150 may select REG136[$i$] or REG137[$i$] if the i-th bit of the string is respectively equal to '1' or '0'.

The signal sTRIM, which is provided onto the trimming terminal of the main POR circuit 22, represents the bits selected by the multiplexer 150. Therefore, before the loading of the digital code into the first and the second registers 136, 137, the signal sTRIM represents the string stored in the programmable circuit 152, which forms the abovementioned default value of the volatile memory 135. However, the loading of the digital code into the first and the second registers 136, 137 causes these latter to store the same content, therefore the signal sTRIM represents, after said loading, the digital code.

In practice, by programming the string stored in the programmable circuit 152, it is possible to set the default value of the volatile memory 135, thereby obtaining a sort of pre-trimming of the main POR circuit 22, i.e., an adjustment of the values of the threshold voltages VRmin, VRmax, VFmin and VFmax.

Finally, in general the non-volatile memory 25 may be rewritten during the lifetime of the integrated electronic system 20, in order to adapt the value of the digital code to compensate variations over time of the values of the components of the integrated electronic system 20 and of the packaging thereof.

The invention claimed is:

1. An integrated electronic system, comprising:
   a digital stage of a resettable type that is configured for operation when a supply voltage is higher than a main voltage threshold, said digital stage comprising a non-volatile memory configured to store a digital code, and a reading stage coupled to the non-volatile memory;
   a main power-on reset circuit configured to generate a main reset signal having a respective logic reset value that activates reset of the reading stage and a respective logic non-reset value that deactivates reset of the reading stage;
   wherein the main power-on reset circuit is configured to:
      when the main reset signal is equal to the respective logic reset value and the supply voltage overcomes a first operative threshold, set the main reset signal to the respective logic non-reset value; and
      when the main reset signal is equal to the respective logic non-reset value and the supply voltage drops below a second operative threshold, set the main reset signal to the respective logic reset value;
   a volatile memory of a resettable type that is coupled to the reading stage, wherein the volatile memory is configured to store a default value when subject to reset;
   an auxiliary power-on reset circuit configured to generate an auxiliary reset signal having a respective logic reset value activating reset of the volatile memory and having a respective logic non-reset value deactivating reset of the volatile memory;
   wherein the auxiliary power-on reset circuit being configured to:
      when the auxiliary reset signal is equal to the respective logic reset value and the supply voltage overcomes a first auxiliary operative threshold, set the auxiliary reset signal to the respective logic non-reset value; and
      when the auxiliary reset signal is equal to the respective logic non-reset value and the supply voltage drops below a second auxiliary operative threshold, set the auxiliary reset signal to the respective logic reset value;

wherein the first and the second auxiliary operative thresholds are lower than the main voltage threshold; and wherein the reading stage is configured to load, following the deactivation of the reset of the reading stage, the digital code into the volatile memory for storage until the reset of the volatile memory is activated;

wherein the main power-on reset circuit is configured to function in a non-trimmed configuration when the volatile memory respectively stores the default value, where the first and the second operative thresholds respectively fall within a first non-trimmed voltage range and a second non-trimmed voltage range which extend above said main voltage threshold; and wherein the main power-on reset circuit is configured to function in a trimmed configuration when the volatile memory respectively stores the digital code, where the first and the second operative thresholds respectively fall within a first trimmed voltage range and a second trimmed voltage range which respectively fall inside the first and second non-trimmed voltage ranges.

2. The integrated electronic system according to claim 1, wherein the first and second trimmed voltage ranges with respect to, respectively, the first and the second non-trimmed voltage ranges depend on the digital code.

3. The integrated electronic system according to claim 1, wherein the first and second auxiliary operative thresholds are higher than a retention voltage corresponding to a minimum value of the supply voltage such that the volatile memory stores one of the default value or the digital code.

4. The integrated electronic system according to claim 1, wherein the digital stage further includes:
a reset stage configured to generate a system reset signal as a function of the main reset signal; and
a digital circuitry of the resettable type that is reset in response to the system reset signal.

5. The integrated electronic system according to claim 1, wherein the volatile memory is configured to be supplied with the supply voltage; and wherein the non-volatile memory and the reading stage are configured to be supplied with a reduced voltage that is lower than the supply voltage; the integrated electronic system further comprising a level shifter that is electrically interposed between the reading stage and the volatile memory.

6. The integrated electronic system according to claim 1, wherein the volatile memory comprises:
a first register configured to store a number of bits equal to a first logic state when the volatile memory is subject to reset;
a second register configured to store a number of bits equal to a second logic state when the volatile memory is subject to reset;
a multiplexer coupled to the first and the second registers and to the main power-on reset circuit, wherein the multiplexer is configured to select, for each pair of corresponding bits of the first and the second registers, one of the bits of the pair, the bits selected by the multiplexer forming, when the volatile memory is subject to reset, the default value of the volatile memory; and
wherein the integrated electronic system further comprises a programmable circuit configured to be permanently programmed to store a string of bits;
wherein each selection carried out by the multiplexer is controlled by a corresponding bit of the string, so that, when the volatile memory is subject to reset, the default value depends on the string of bits with the first and second non-trimmed voltage ranges depending on said default value; and wherein the reading stage is configured to load, following the deactivation of the reset of the reading stage, the digital code into the first and the second registers so that the bits selected by the multiplexer represent the digital code.

7. The integrated electronic system according to claim 1, wherein the second operative threshold is lower than the first operative threshold; and wherein the second auxiliary operative threshold is lower than the first auxiliary operative threshold.

8. A method for controlling an integrated electronic system that comprises: a digital stage of a resettable type that is configured for operation when a supply voltage is higher than a main voltage threshold, said digital stage comprising a non-volatile memory, which is configured to store a digital code, and a reading stage, which is coupled to the non-volatile memory; and a volatile memory of a resettable type that is coupled to the reading stage, the volatile memory being configured to store a default value when subject to reset, said method comprising:
generating a main reset signal;
activating reset of the reading stage when the main reset signal has a respective logic reset value;
deactivating reset of the reading stage when the main reset signal has a respective logic non-reset value;
wherein generating a main reset signal comprises:
when the main reset signal is equal to the respective logic reset value and the supply voltage overcomes a first operative threshold, setting the main reset signal to the respective logic non-reset value; and
when the main reset signal is equal to the respective logic non-reset value and the supply voltage drops below a second operative threshold, setting the main reset signal to the respective logic reset value;
generating an auxiliary reset signal;
activating reset of the volatile memory when the auxiliary reset signal has a respective logic reset value;
deactivating reset of the volatile memory when the auxiliary reset signal has a respective logic non-reset value;
wherein generating the auxiliary reset signal comprises:
when the auxiliary reset signal is equal to the respective logic reset value and the supply voltage overcomes a first auxiliary operative threshold, setting the auxiliary reset signal to the respective logic non-reset value; and
when the auxiliary reset signal is equal to the respective logic non-reset value and the supply voltage drops below a second auxiliary operative threshold, setting the auxiliary reset signal to the respective logic reset value, the first and second auxiliary operative thresholds being lower than the main voltage threshold; and
loading, by the reading stage, the digital code into the volatile memory following the deactivation of the reset of the reading stage;
storing the digital code by the volatile memory until the reset of the volatile memory is activated;
wherein, when the volatile memory stores the default value, the first and second operative thresholds respectively fall within a first non-trimmed voltage range and a second non-trimmed voltage range which extend above said main voltage threshold;
wherein, when the volatile memory stores the digital code, the first and second operative thresholds respectively fall within a first trimmed voltage range and a second trimmed voltage range which respectively fall inside the first and second non-trimmed voltage ranges.

9. The method according to claim 8, wherein the first and second trimmed voltage ranges with respect to, respectively, the first and second non-trimmed voltage ranges depend on the digital code.

10. The method according to claim 8, wherein the digital stage further includes a digital circuitry of the resettable type, said method further comprising:
   generating a system reset signal as a function of the main reset signal; and
   controlling the reset of the digital circuitry through the system reset signal.

11. The method according to claim 8, further comprising:
   supplying the volatile memory with the supply voltage;
   supplying the non-volatile memory and the reading stage with a reduced voltage which is lower than the supply voltage; and
   wherein said integrated electronic system further comprises a level shifter, which is electrically interposed between the reading stage and the volatile memory.

12. The method according to claim 8, wherein the volatile memory comprises a first and a second register, said method comprising:
   storing a number of bits equal to a first logic state in the first register when the volatile memory is subject to reset;
   storing a number of bits equal to a second logic state in the second register when the volatile memory is subject to reset;
   selecting, for each pair of corresponding bits of the first and second registers, one of the bits of the pair, the bits selected forming, when the volatile memory is subject to reset, the default value of the volatile memory;
   permanently storing a string of bits, each bit selection being controlled by a corresponding bit of the string, so that, when the volatile memory is subject to reset, the default value depends on the string of bits, the first and the second non-trimmed voltage ranges depending on said default value; and
   loading, by the reading stage, following the deactivation of the reset of the reading stage, the digital code into the first and the second registers, so that the bits of each of the first and the second registers form the digital code.

* * * * *